United States Patent [19]

Nordin

[11] Patent Number: 5,289,694
[45] Date of Patent: Mar. 1, 1994

[54] CIRCUIT CARD MOUNTING ASSEMBLY

[75] Inventor: Ronald A. Nordin, Naperville, Ill.

[73] Assignee: AT&T Bell Laboratories, Murray Hill, N.J.

[21] Appl. No.: 23,306

[22] Filed: Feb. 26, 1993

[51] Int. Cl.$^5$ .......................... F28D 15/00; H05H 7/20
[52] U.S. Cl. .................................. 62/259.2; 165/80.4; 165/104.33; 361/699; 361/701
[58] Field of Search ................................. 62/259.2, 118; 165/80.4, 104.33; 361/381, 382, 385, 390

[56] References Cited

U.S. PATENT DOCUMENTS

| | | | |
|---|---|---|---|
| 3,504,268 | 3/1970 | Hoffmann et al. | 361/382 |
| 3,952,797 | 4/1976 | Voboril et al. | 165/80 |
| 4,449,576 | 5/1984 | Baum et al. | 165/104.33 |
| 4,514,746 | 4/1985 | Lundqvist | 361/385 |
| 4,646,202 | 2/1987 | Hook et al. | 361/382 |
| 4,793,405 | 12/1988 | Diggelmann et al. | 165/104.33 |
| 5,063,475 | 11/1991 | Balan | 361/384 |

Primary Examiner—Henry A. Bennet
Assistant Examiner—William C. Doerrler
Attorney, Agent, or Firm—Dwight A. Marshall

[57] ABSTRACT

An assembly for mounting circuit cards having high power electrical and optical alloy MCM chip devices installed thereon. The assembly has a central vertical coolant supply pipe extending from a pump to a heat exchanger unit through a refrigeration unit separated from the heat exchanger unit by circuit board mounting shelves equipped with electrical and optical backplane apparatus interconnecting circuit cards mounted in the mounting shelves. The heat exchanger unit has radiator fins separated by vanes extended outward from a hub of the unit and is interconnected by return pipes extending through the circuit card mounting shelves and terminated in the refrigeration unit which is connected by a return pipe to the pump. Vent pipes connected with the heat exchanger vanes extend from the heat exchanger unit into circuit card mounting shelves in engagement with mounted circuit cards to transfer heat generated by the engaged circuit cards to the heat exchanger unit. The vent pipes are displaced to engage heat exchanger connectors terminating the vent pipes with circuit card heat sinks when the circuit cards are installed in the mounting shelf to effect a transfer of heat generated by the mounted circuit cards to the heat exchanger unit.

10 Claims, 5 Drawing Sheets

CIRCUIT CARD MOUNTING ASSEMBLY

TECHNICAL FIELD

The invention relates to a circuit card mounting assembly and in particular to a circuit card mounting assembly for interconnecting plug-in circuit cards mounting high power electrical and optical components.

BACKGROUND AND PROBLEM

Electrical and electronic equipment is oftentimes constructed of circuit cards mounting components and which are interconnected by a circuit card mounting assembly to form the equipment. Typically, a circuit card mounting assembly is constructed with rows of shelves wherein each shelf is open at the front and arranged to receive a number of plug-in circuit cards. The back of each shelf may have cabling or printed wiring backplane structures arranged to receive each plug-in circuit card and interconnect the received circuit cards to form the electrical and electronic equipment.

Components mounted on each plug-in circuit card generate heat which is required to be dissipated to insure proper operation of the circuit card and other circuit cards plugged into the circuit card mounting assembly. In low power equipment applications, the shelves may be sufficiently spaced apart to allow the component generated heat to dissipate among the shelves without damage to the plug-in circuit cards mounted in the circuit card mounting assembly. Higher power equipment requires that cooling fans be installed in the circuit card mounting assembly to dissipate the component generated heat. In yet higher power equipment, cooling mediums are required to circulate throughout the circuit mounting assembly and around the mounted circuit cards to cool the circuit card mounted components.

A problem arises in that new types of components in addition to generating more heat are smaller in size thereby allowing more components to be mounted on a circuit card and which causes more heat to be generated by the circuit card. Accordingly, a need exists for a plug-in circuit card mounting assembly arranged to engage circuit cards as they are inserted into a circuit card mounting assembly and transfer the heat generated by the mounted circuit cards to heat transfer apparatus of the circuit card mounting assembly which is arranged to dissipate the circuit card component generated heat.

SOLUTION

The foregoing problem is solved by a circuit card mounting assembly intended for use in mounting plug-in types of high power circuit cards and for dissipating heat generated by high power components of the mounted circuit cards. The assembly has shelves each displaced from the other and which are intended to receive and mount circuit cards. Each circuit card mounting shelf is equipped with electrical and optical backplane apparatus for interconnecting the shelves and circuit cards mounted in the shelves. The assembly also has a heat exchanger unit mounted at the top of the assembly and a refrigeration unit mounted at the bottom of the assembly with each separated from the other by the circuit card mounting shelves. Each unit is formed of a plurality of radiator fins separated by vanes and is interconnected by return pipes extending between the units through the circuit card mounting shelves.

The assembly is equipped with vent pipes having one end connected with the heat exchanger unit vanes and each extended downward from the heat exchanger unit into a circuit card mounting shelf. Each vent pipe is positioned in engagement with a circuit card mounted in a shelf and operates to transfer heat generated by the engaged circuit card to the heat exchanger unit. Pump apparatus, connected by a coolant supply pipe located in the center of the assembly with the heat exchanger unit and by a coolant return pipe with the refrigeration unit, supplies a continuous flow of coolant around the radiator fins and vanes to absorb heat from the vent pipes. The coolant is returned through the return pipes to the refrigeration unit to remove the absorbed heat generated by mounted circuit cards.

Heat exchanger connectors are positioned in the circuit card mounting shelves terminating other ends of the vent pipes engaged with the heat exchanger vanes. The vent pipes are displaced to engage and disengage the heat exchanger connectors with circuit card heat sinks thereby enabling circuit cards to be installed, mounted and removed from the circuit card mounting shelves. Each heat exchanger connector engaged with a heat sink positioned on a mounted circuit card transfers heat generated by components located on a mounted circuit card to the heat exchanger unit.

DETAILED DESCRIPTION

Figure 1:
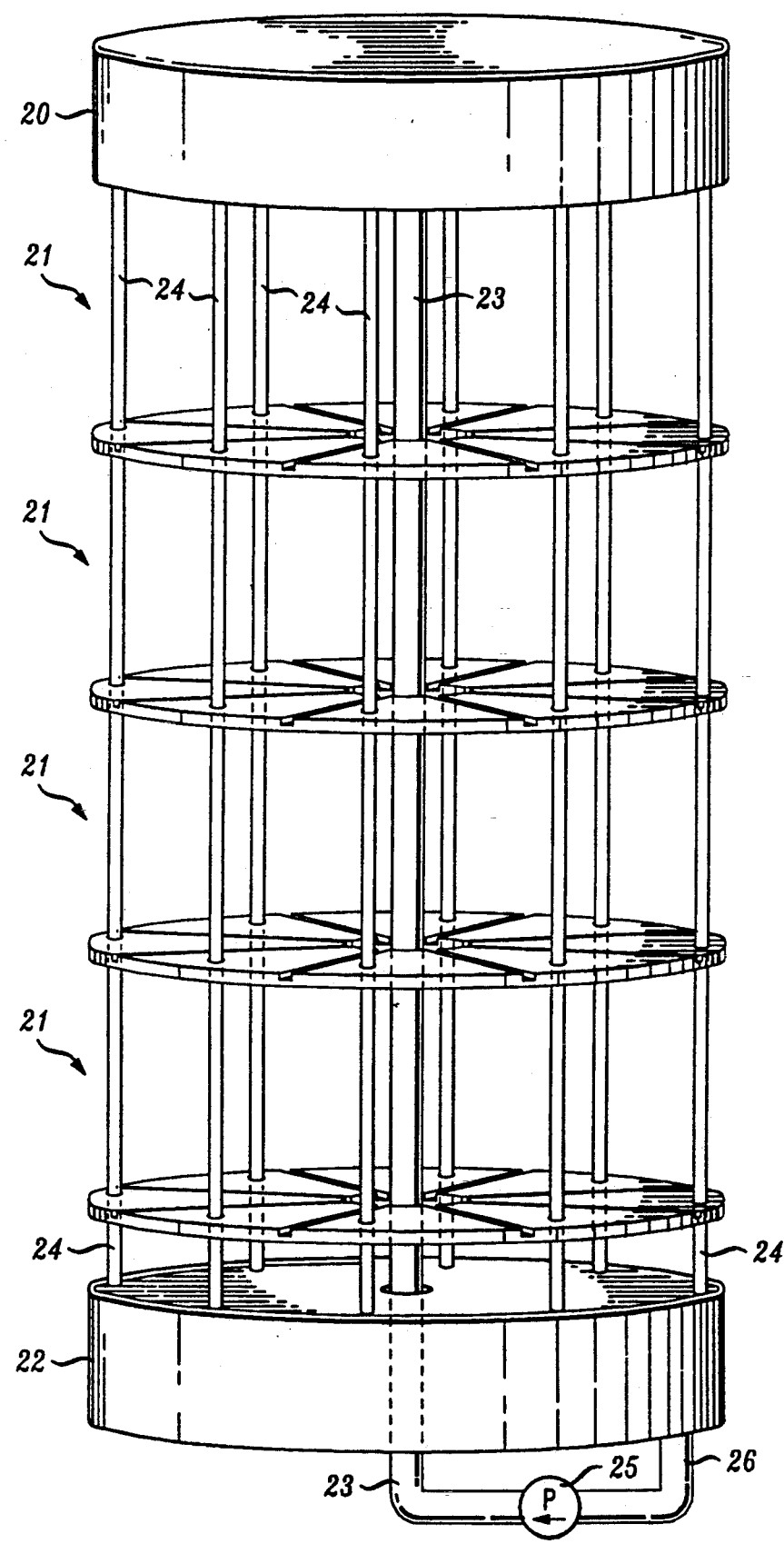
FIG. 1 illustrates a circuit card mounting assembly in accordance with the principles of the invention.
Figure 2:
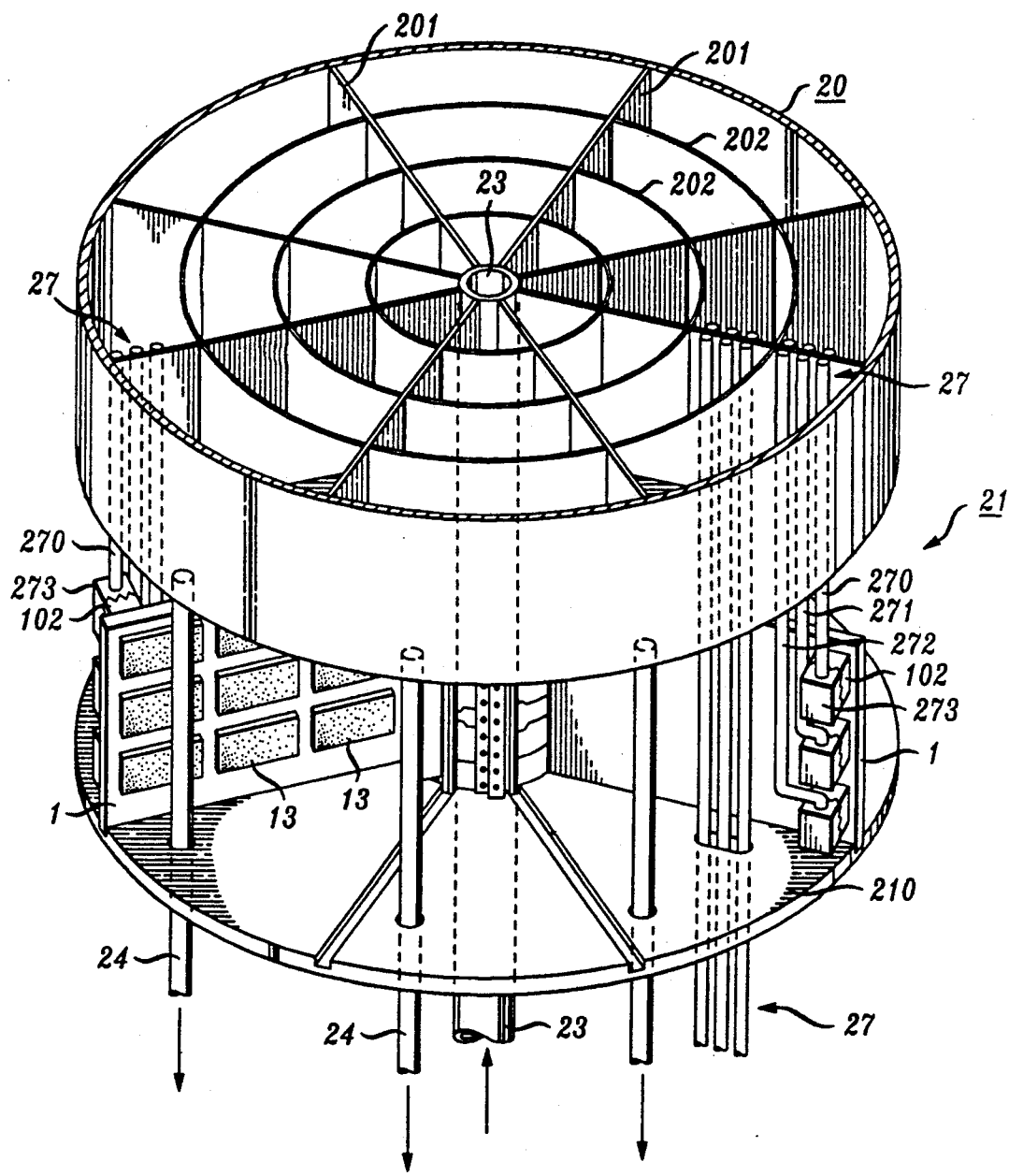
FIG. 2 illustrates a heat exchanger unit and circuit cards installed in a circuit card mounting shelf of the circuit card mounting assembly set forth in FIG. 1.

In an exemplary embodiment of the invention, FIG. 1, circuit card mounting assembly 2 is arranged to receive and mount high power circuit cards 1, FIG. 2, utilizing electrical and optical components 13. As set forth in FIG. 1, assembly 2 is a frame structure having shelf apparatus 21 for receiving and mounting circuit cards and for interconnecting the mounted circuit cards. Interconnected radiation and heat exchanger apparatus, such as heat exchanger unit 20 and refrigeration unit 22, is separated by circuit card mounting shelves 21 and functions to dissipate heat generated by circuit cards installed and mounted in shelves 21. Return pipes 24 interconnect heat exchanger unit 20 with refrigeration unit 22 to provide a continuous flow of coolant through pump 25 to the assembly. Heat transfer apparatus 27, FIG. 2, extends from heat exchanger unit 20 into each circuit card mounting shelf 21 and engages circuit cards upon insertion of the circuit cards into mounting shelves 21. The heat transferring apparatus transfers heat generated by a shelf mounted circuit card 1 to heat exchanger unit 20 for dissipation.

Figure 3:
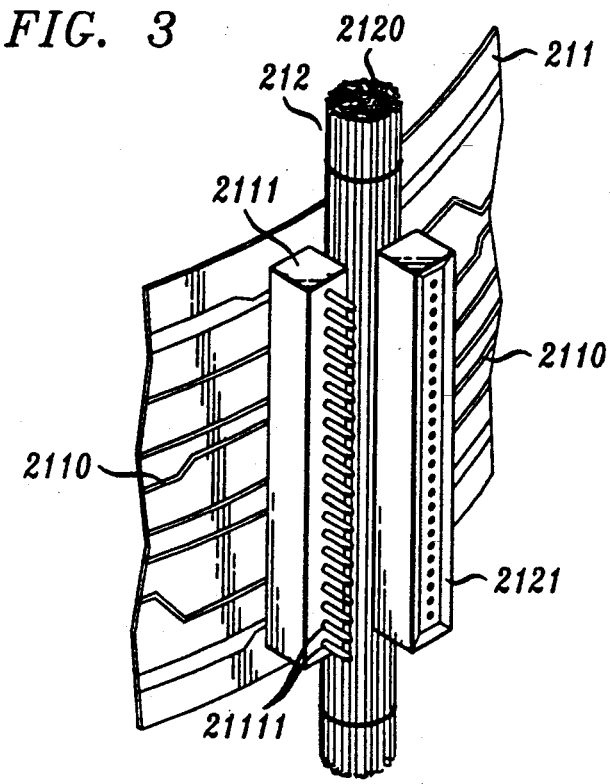
FIG. 3 illustrates a backplane assembly for interconnecting circuit cards installed in the circuit card mounting assembly set forth in FIGS. 1 and 2.

Each circuit card mounting shelf 21 is of a generally circular configuration and is displaced from adjacent shelves by a sufficient distance so as to receive and mount multiple circuit cards 1. Mounting shelves 21 are equipped with backplane apparatus, FIGS. 3 and 4, for electrically and optically interconnecting shelves 21 and mounted circuit cards 1. Typically, although not limited thereto, a backplane may consist of a flexible printed wiring circuit 211 in combination with an optical fiber bundle 212. Printed wiring circuit 211 has electrical conducting paths 2110 formed thereon that serve to interconnect circuit cards installed in a mounting shelf 21. In addition, printed wiring circuit 211 for each shelf 21 may also be coupled with other mounting shelves 21 backplane printed wiring circuits 211 to interconnect shelves such that a circuit card 1 mounted in one shelf 21 may be selectively interconnected with another circuit card 1 mounted in another mounting shelf 21. Various ones of electrical conducting paths 2110 are terminated by electrical male, female or edge board connectors 2111, positioned along printed wiring circuit 211 within a mounting shelf 21 to correspond with a circuit card mounting location.

The backplane apparatus may also have an optical fiber bundle 212 comprised of optical fibers 2120 that serve to interconnect optical components that may be located on circuit board 1 with optical components that are located on other circuit cards mounted on the same mounting shelf 21 or on other mounting shelves on circuit card mounting assembly 2. Optical fibers 2120 may be located in a bundle 212 extending between mounting shelves 21 and in another bundle, not shown, that may be formed along printed wiring circuit 211 to extend between multiple circuit card installation locations of a single mounting shelf 21. Ones of bundled fibers 2120 are terminated on optical connectors, such as optical connector 2121, that serves to connect optical components located on a circuit card 1 mounted in a mounting shelf 21 with the connector terminated fibers 2120.

Figure 4:
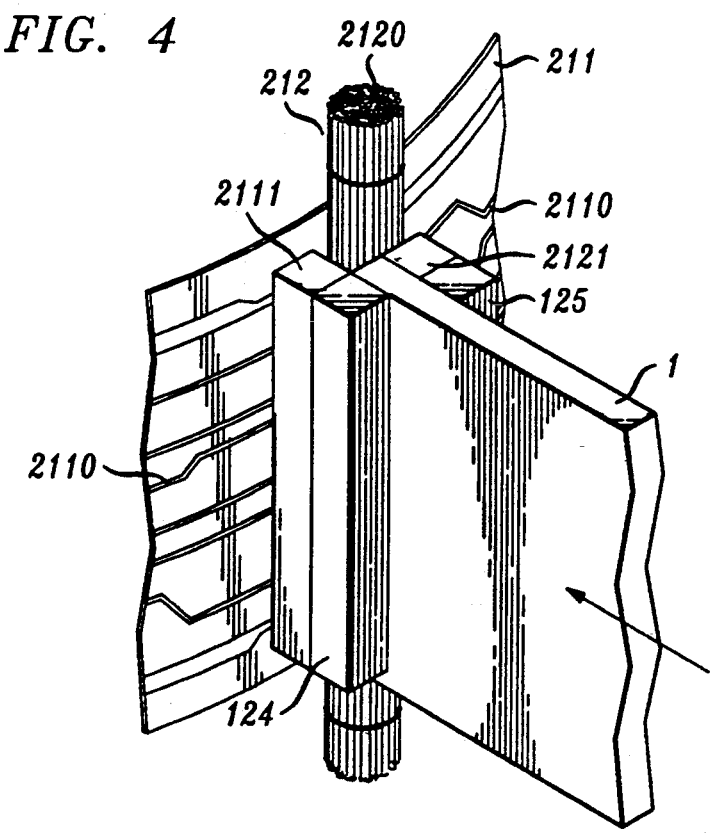
FIG. 4 illustrates a circuit card installed in the backplane assembly of FIG. 3.

Circuit board 1, FIG. 4, may be equipped with an electrical connector 124, an optical connector 125 or a combination of electrical and optical connectors 124, 125. Such types of circuit cards are set forth in a copending application filed by R. A. Nordin on Feb. 8, 1993, and need not be disclosed in detail for an understanding of the present invention. It is to be understood that other types of circuit cards may be mounted in the present mounting assembly 2. Sufficient to say that when circuit card 1 is plugged or inserted into mounting shelf 21, circuit card electrical connector 124 is mated and engaged with a corresponding backplane electrical connector 2111 and circuit card optical connector 125 is mated and engaged with backplane optical connector 2121. Thus, both the electrical and optical circuitry of circuit card 1 is connected with the interconnecting backplane apparatus via mated electrical connectors 124, 2111 and optical connectors 125, 2121.

Heat exchanger unit 20, FIG. 1, may have a generally circular configuration and is located at the top of circuit card mounting assembly 2. Unit 20, FIG. 2, is formed of a plurality of circular radiator fins 202 separated by vanes 201 extended outward from a central hub. Coolant supply pipe 23, FIG. 1, is connected with pump unit 25 and extends upward through the center of circuit card mounting unit 2 to the hub of heat exchanger unit 20 to supply a continuous flow of coolant. A plurality of return pipes 24 are positioned around the outer edges of mounting assembly 2 and extend through circuit card mounting shelves 21 to interconnect heat exchanger 20 with similarly configured refrigeration unit 22 separated from heat exchanger unit 20 by circuit card mounting shelves 21.

Circuit card mounting assembly 2, FIG. 2, also has a plurality of vent pipes 27 having one end connected with the heat exchanger vanes 201 and each extended downward from heat exchanger unit 20 into circuit card mounting shelves 21. Vent pipes 27 are engaged with circuit cards 1 inserted and mounted in mounting shelves 21 and serve to transfer heat generated by engaged circuit cards 1 to heat exchanger unit 20. Pump 25, FIG. 1, and coolant supply pipe 23 connected with heat exchanger unit 20 supply a continuous flow of coolant around radiator fins 201 and vanes 202, FIG. 2, to absorb the mounted circuit card generated heat from vent pipes 27. The warmed coolant flows through return pipes 24 to refrigeration unit 22, FIG. 1, which has a similar configuration as heat exchanger unit 20 and which functions to remove the absorbed heat and return the coolant through pipe 26 to pump 25.

Figure 6:
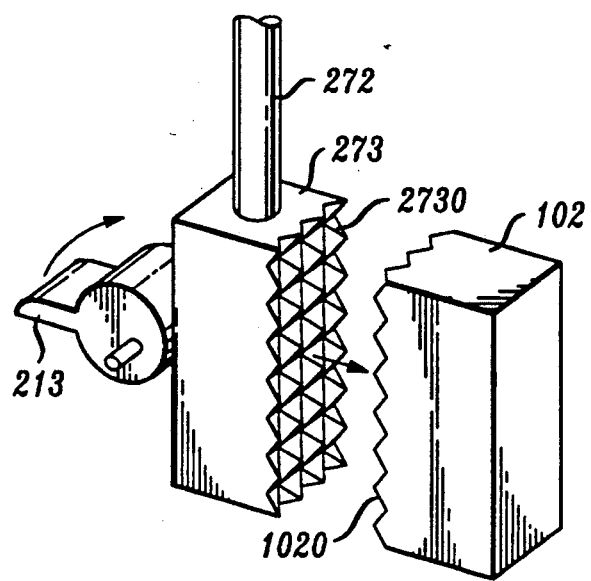

Each vent pipe, for example vent pipe 272 of a group of vent pipes 27, FIG. 6, has a heat exchanger connector 273 positioned in a circuit card mounting shelf 21 terminating another end of vent pipe 272 opposite the end engaging a heat exchanger vane 201, FIG. 2. Heat exchanger connector 273, FIG. 6, is formed to engage a heat sink 102 of a mounted circuit card 1 and transfer the circuit card generated heat from heat sink 102 to vent pipe 272.

Figure 5:
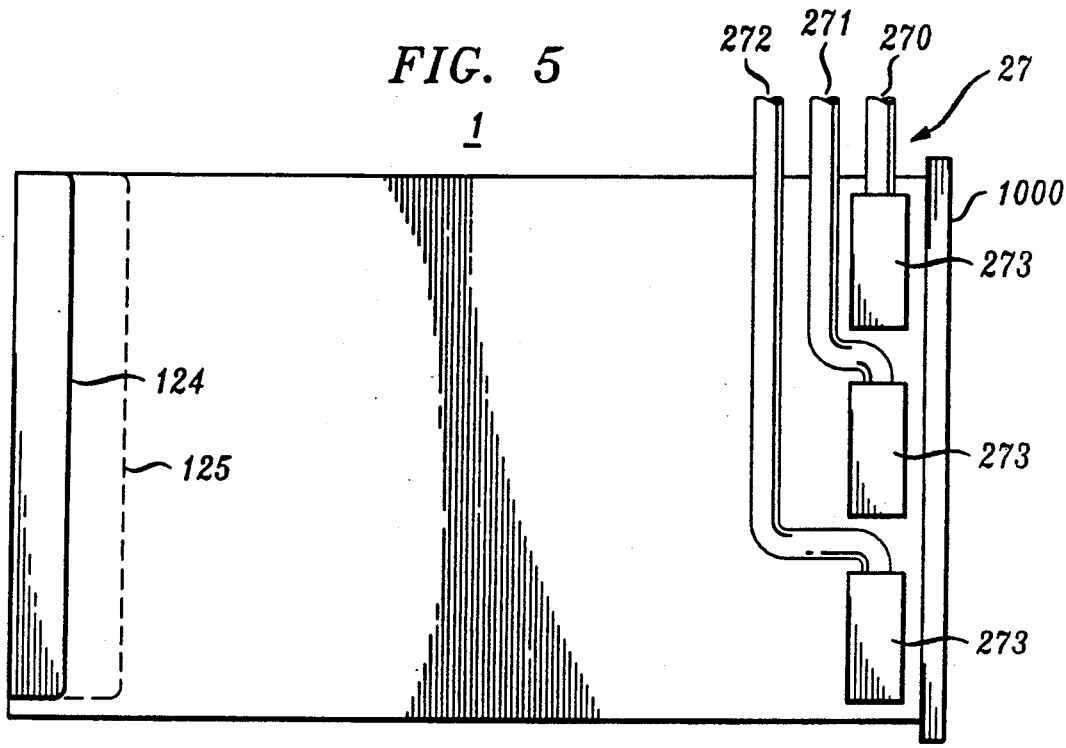
FIG. 5 illustrates vent pipes of the circuit card mounting assembly set forth in FIG. 2 engaged with a mounted circuit card for transferring heat generated by the circuit card to the heat exchanger unit of FIGS. 1 and 2, FIG. 6 sets for a vent pipe heat exchanger connector formed to engage a circuit card heat sink.

It is assumed that plug-in circuit cards 1, FIG. 2, although not limited thereto, are of a type having heat sinks 102 which absorb heat generated by electrical and optical components 13 mounted on surfaces of circuit card 1. Typically, a circuit card 1 may have three heat sinks 102 mounted on circuit card 1, FIG. 5, at one end opposite another end mounting connectors 124, 125. A vent pipe assembly 27 may have, although not limited thereto, three vent pipes 270, 271, 272 that are formed such that their corresponding heat exchanger connectors 273, terminating each vent pipe 270, 271, 272, are positioned within mounting shelf 21 to engage a corresponding heat sink 102 located on a circuit card 1 inserted into and mounted on mounting shelf 21. When a circuit card 1 is properly mounted in a mounting shelf 21, heat exchanger connectors 273 engage corresponding heat sinks 102 of circuit card 1, FIG. 2, and transfer the circuit card generated heat via vent pipe assembly 27 to heat exchanger vanes 201 for dissipation.

Figure 7:
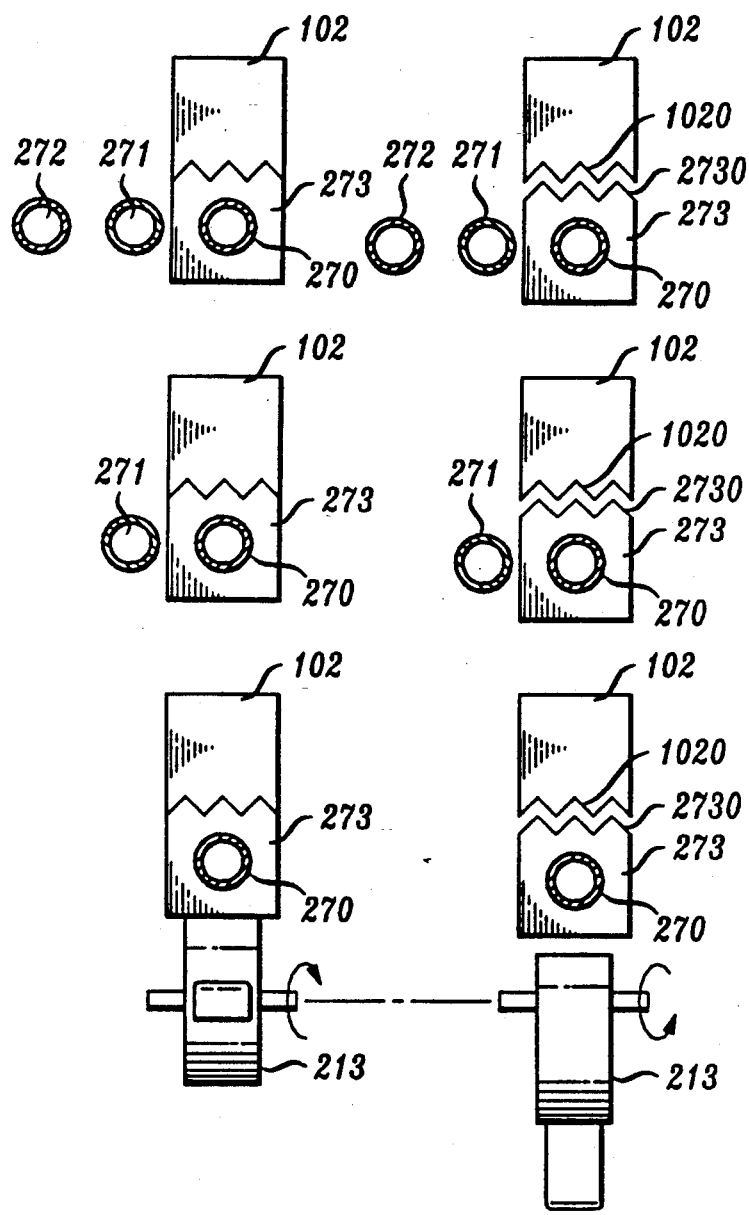
FIG. 7 illustrates apparatus displacing the vent pipes of FIGS. 2, 5 and 6 to engage heat exchanger connectors with a circuit card heat sinks.

A face of each heat exchanger connector 273, FIG. 6, facing a circuit card 1 mounted in mounting shelf 21 is formed with a serrated surface 2730 corresponding with a similar configured serrated surface 1020 of a circuit board heat sink 102. Both serrated surfaces 2730, 1020 are configured to mate with the other to provide a maximum surface junction to transfer component generated heat from circuit card heat sink 102 through the mated and matched junction to heat exchanger connector 273. When a circuit card 1, FIG. 2, is inserted into a mounting shelf 21 engaging apparatus, which may be in the form of a cam structure 213, FIG. 6, is operated to laterally displace vent pipes 270, 271, 272 of vent pipe assembly 27, to engage their corresponding heat exchanger connectors 273, FIG. 7, with multiple ones of heat sinks 102 positioned on a circuit card 1 inserted into a mounting shelf 21. The heat exchanger connectors 273 mated with heat sinks 102 transfers heat generated by circuit card components 13 to heat exchanger unit 20 which is dissipated by the continuous flow of coolant supplied by refrigeration unit 22 and pump 25. A medium sealed within each vent tube 270, 271, 272 of a quantity less than 25 percent of the vent tube volume is converted into a vapor by heat generated by a mounted circuit card for conducting the circuit card generated heat from the mounted circuit card 1 to the heat exchanger unit 20.

In removing mounted circuit card 1 from mounting assembly 2, engaging apparatus 213 is operated to allow vent pipe assembly 27 to move back into its original position. Heat exchanger connectors 273 are disengaged from corresponding circuit card heat sinks 102 so that circuit card 1 may be removed from a mounting shelf 21.

I claim:

1. An assembly for mounting a plurality of circuit cards wherein the assembly comprises
   shelf apparatus mounting the circuit cards and interconnecting the mounted circuit cards,
   radiation and heat exchanger apparatus coupled with and separated by the shelf apparatus for dissipating heat generated by the mounted circuit cards, and
   means interconnecting the radiation and heat exchanger apparatus and engaging the circuit cards upon insertion and mounting of the circuit cards into the shelf apparatus for transferring heat generated by the engaged circuit cards to the radiation and heat exchanger apparatus for dissipation,
   said radiation and heat exchanger apparatus comprising a generally circular configured heat exchanger unit formed of a plurality of circular radiator fins separated by vanes extended outward from a hub of the unit and interconnected by a plurality of return pipes extending through the circuit card mounting shelves with a similarly configured refrigeration unit separated from the heat exchanger unit by the circuit card mounting shelves.

2. The circuit card mounting apparatus set forth in claim 1 wherein the shelf apparatus comprises
   a plurality of generally circular configured shelves each displaced from the other for receiving and mounting ones of the circuit cards and wherein each shelf is equipped with backplane apparatus electrically and optically interconnecting circuit cards mounted in the shelves.

3. The circuit card mounting apparatus set forth in claim 1 wherein the heat transferring means comprises
   a plurality of vent pipes connected with the heat exchanger vanes and each extended from the heat exchanger unit into a circuit card mounting shelf in engagement with a mounted circuit card to transfer heat generated by the engaged circuit card to the heat exchanger unit.

4. The circuit card mounting apparatus set forth in claim 3 wherein the radiation and heat exchanger apparatus comprises
   apparatus connected with the heat exchanger unit and supplying a continuous flow of coolant around the radiator fins and vanes to absorb heat from the vent pipes and through the return pipes to the refrigeration unit to remove the absorbed heat generated by mounted circuit cards.

5. The circuit card mounting apparatus set forth in claim 4 wherein each of the vent pipes comprises
   a heat exchanger connector positioned in a circuit card mounting shelf and terminating an end of the vent pipe opposite the end engaging a heat exchanger vane and formed to engage a heat sink of a mounted circuit card.

6. The circuit card mounting apparatus set forth in claim 5 wherein the circuit card mounting apparatus means comprises
   means for displacing the vent pipes to engage their corresponding heat exchanger connectors with multiple heat sinks positioned on circuit cards inserted and mounted in the mounting shelves to transfer heat generated by components located on the mounted circuit cards to the heat exchanger unit.

7. The circuit card mounting apparatus set forth in claim 6 wherein the coolant supply apparatus comprises
   a pump,
   a coolant supply pipe coupled with the pump and extending upward from the pump through a center of the circuit mounting apparatus from the refrigeration unit through the mounting shelf backplane apparatus to the heat exchanger hub to supply the continuous flow of coolant to the heat exchanger unit, and
   a coolant return pipe coupled with the pump and the refrigeration unit to return the coolant from the refrigeration unit to the pump.

8. A circuit card mounting apparatus set forth in claim 7 wherein the vent pipes comprise
   a medium sealed within each vent tube of a quantity less than 25 percent of the vent tube volume and which is converted into a vapor by heat generated by a mounted circuit card for conducting the circuit card generated heat from the mounted circuit card to the heat exchanger unit.

9. An assembly for mounting circuit cards wherein the assembly comprises
   a plurality of shelves each displaced from the other for receiving and mounting ones of the circuit cards and wherein each shelf is equipped with backplane apparatus interconnecting circuit cards mounted in the shelves,
   a heat exchanger unit and a refrigeration unit each formed of a plurality of radiator fins separated by vanes and interconnected by a plurality of return pipes extending through the circuit card mounting shelves,
   a plurality of vent pipes having one end connected with the heat exchanger vanes and each extended from the heat exchanger unit into a circuit card mounting shelf in engagement with a mounted circuit card to transfer heat generated by the engaged circuit card to the heat exchanger unit,
   apparatus connected with the heat exchanger unit and the refrigeration unit and supplying a continuous flow of coolant around the radiator fins and vanes to absorb heat from the vent pipes and through the return pipes to the refrigeration unit to remove the absorbed heat generated by mounted circuit cards,
   heat exchanger connectors positioned in the circuit card mounting shelves and terminating other ends of the vent pipes for engaging heat exchanger vanes, and means for displacing ones of the vent pipes to engage the heat exchanger connectors with corresponding heat sinks positioned on mounted circuit cards to transfer heat generated by components located on the mounted circuit cards to the heat exchanger unit.

10. An assembly for mounting circuit cards wherein the assembly comprises a plurality of generally circular configured shelves each displaced from the other for receiving and mounting ones of the circuit cards and wherein each shelf is equipped with backplane apparatus electrically and optically interconnecting circuit cards mounted in the shelf, a generally circular configured heat exchanger unit formed of a plurality of circular radiator fins separated by vanes extended outward from a hub of the unit and interconnected by a plurality of return pipes extending through the circuit card mounting shelves and terminated in a similarly configured refrigeration unit separated from the heat exchanger unit by the circuit card mounting shelves, a plurality of vent pipes having one end connected with the heat exchanger vanes and each extended from the heat exchanger unit into the circuit card mounting shelves in engagement with the mounted circuit cards to transfer heat generated by the engaged circuit cards to the heat exchanger unit, apparatus connected with the heat exchanger unit and supplying a continuous flow of coolant around the radiator fins and vanes to absorb heat from the vent pipes and through the return pipes to the refrigeration unit to remove the heat generated by mounted circuit cards, heat exchanger connectors positioned in the circuit card mounting shelves and terminating other ends of the vent pipes for engaging the heat exchanger vanes, and means for displacing ones of the vent pipes to engage corresponding heat exchanger connectors with multiple ones of heat sinks positioned on a circuit card inserted into one of the mounting shelves to transfer heat generated by components located on the mounted circuit card to the heat exchanger unit.

* * * * *